United States Patent [19]

Tamaki et al.

[11] Patent Number: 5,629,548

[45] Date of Patent: May 13, 1997

[54] SEMICONDUCTOR DEVICE WITH ADJUSTABLE CHANNEL WIDTH

[75] Inventors: Tutomu Tamaki, Yokohama; Kiyomi Naruke, Ebina, both of Japan

[73] Assignee: Kabushiki Kaisha Toshiba, Kawasaki, Japan

[21] Appl. No.: 386,477

[22] Filed: Feb. 10, 1995

[30] Foreign Application Priority Data

Feb. 12, 1994 [JP] Japan ................................. 6-037687

[51] Int. Cl.⁶ .................... H01L 29/94; H01L 31/062; H01L 31/113; H01L 31/119
[52] U.S. Cl. .................... 257/400; 257/391; 257/392
[58] Field of Search .............................. 257/400, 391, 257/390–392, 399, 345, 395, 321

[56] References Cited

U.S. PATENT DOCUMENTS

| | | |
|---|---|---|
| 4,272,830 | 6/1981 | Moench . |
| 4,317,273 | 3/1982 | Guterman et al. ............ 357/41 |
| 4,395,725 | 7/1983 | Parekh . |
| 4,811,066 | 3/1989 | Pfiester et al. ............ 257/391 |
| 5,168,465 | 12/1992 | Harari ............ 257/321 |
| 5,285,069 | 2/1994 | Kaibara et al. ............ 257/392 |
| 5,357,137 | 10/1994 | Hayama ............ 257/400 |

FOREIGN PATENT DOCUMENTS

| | | |
|---|---|---|
| 0119729 | 9/1984 | European Pat. Off. . |
| 0448141 | 9/1991 | European Pat. Off. . |
| 3-185758 | 8/1991 | Japan . |

OTHER PUBLICATIONS

Bernstein et al., IBM Technical Disclosure Bulletin, "Four–State Memory Cell for Read–Only Storage", vol. 23, No. 10, Mar. 1981, p. 4461.

*Primary Examiner*—Sara W. Crane
*Assistant Examiner*—Adriana Giordana
*Attorney, Agent, or Firm*—Finnegan, Henderson, Farabow, Garrett & Dunner, L.L.P.

[57] ABSTRACT

A semiconductor device having N-type source and drain regions formed substantially in parallel to each other in the surface of a P-type semiconductor substrate. A channel region having first to fourth edges are sandwiched between each pair of the source and drain regions on the first and second edges. A gate insulating film is formed on the semiconductor substrate. Gate electrodes are formed substantially in parallel to each other on the semiconductor substrate via gate insulating film so as to cross the source and drain regions. The first and second edges of the channel regions are substantially parallel to the source and drain regions, and third and fourth regions are substantially parallel to the gate electrodes. A P-type impurity diffusion region is formed by ion implantation in accordance with self-alignment with gate electrode, at least on either of the third or fourth edge of at least one of the channel regions. An impurity concentration of the impurity diffusion region is adjusted such that it is higher than that of the semiconductor substrate.

3 Claims, 10 Drawing Sheets

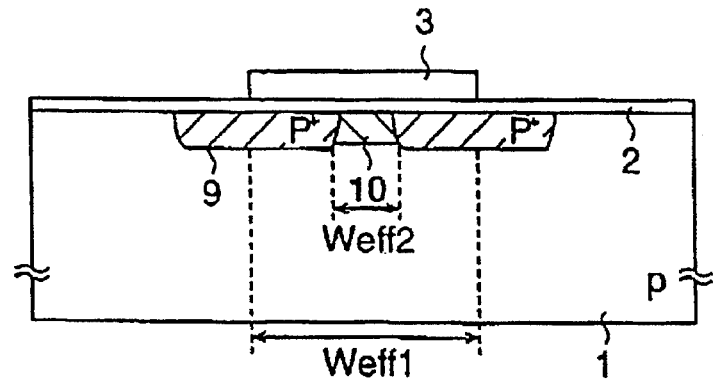
F I G. 6A
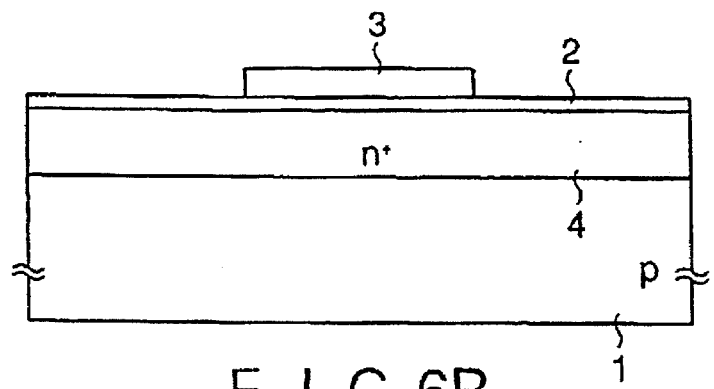
F I G. 6B
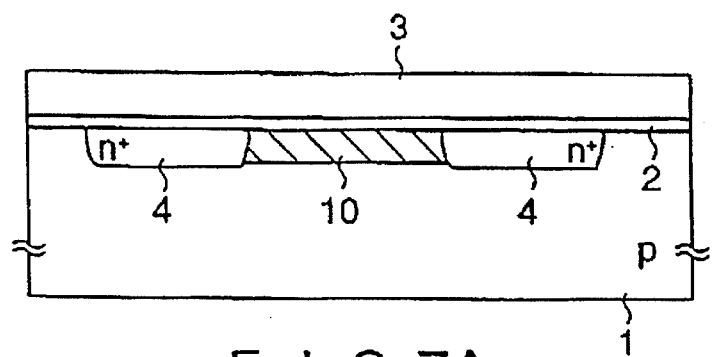
F I G. 7A
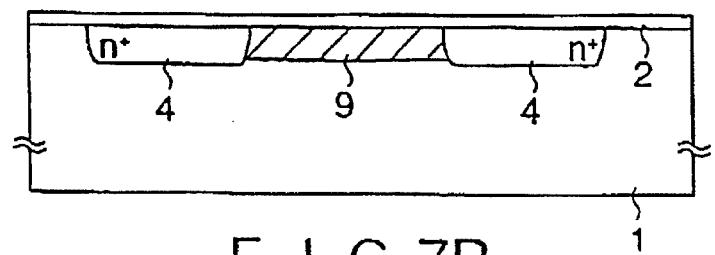
F I G. 7B

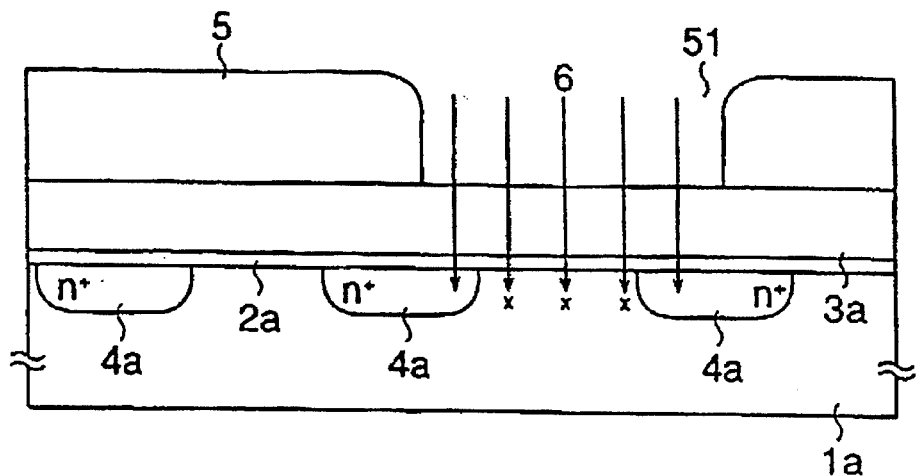
F I G. 10
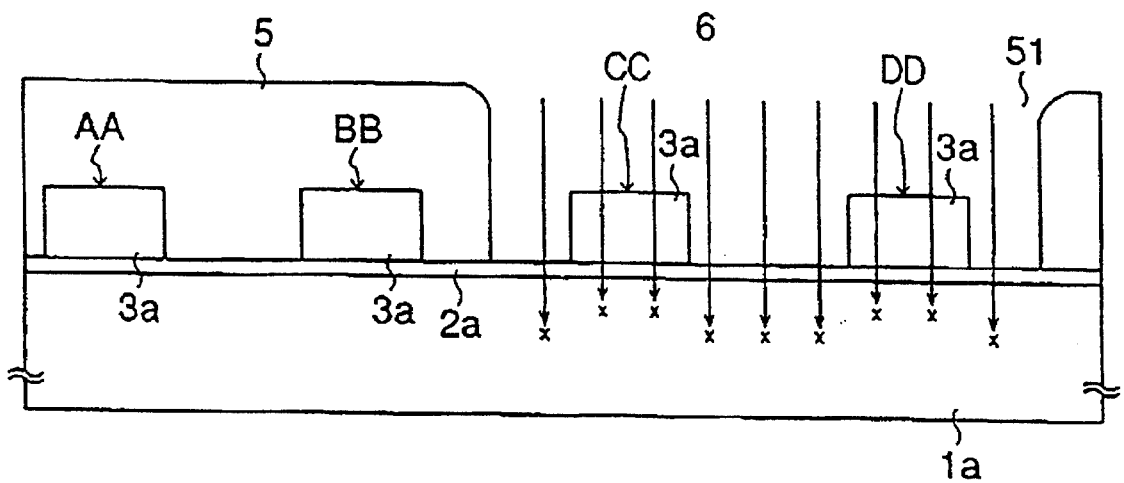
F I G. 11

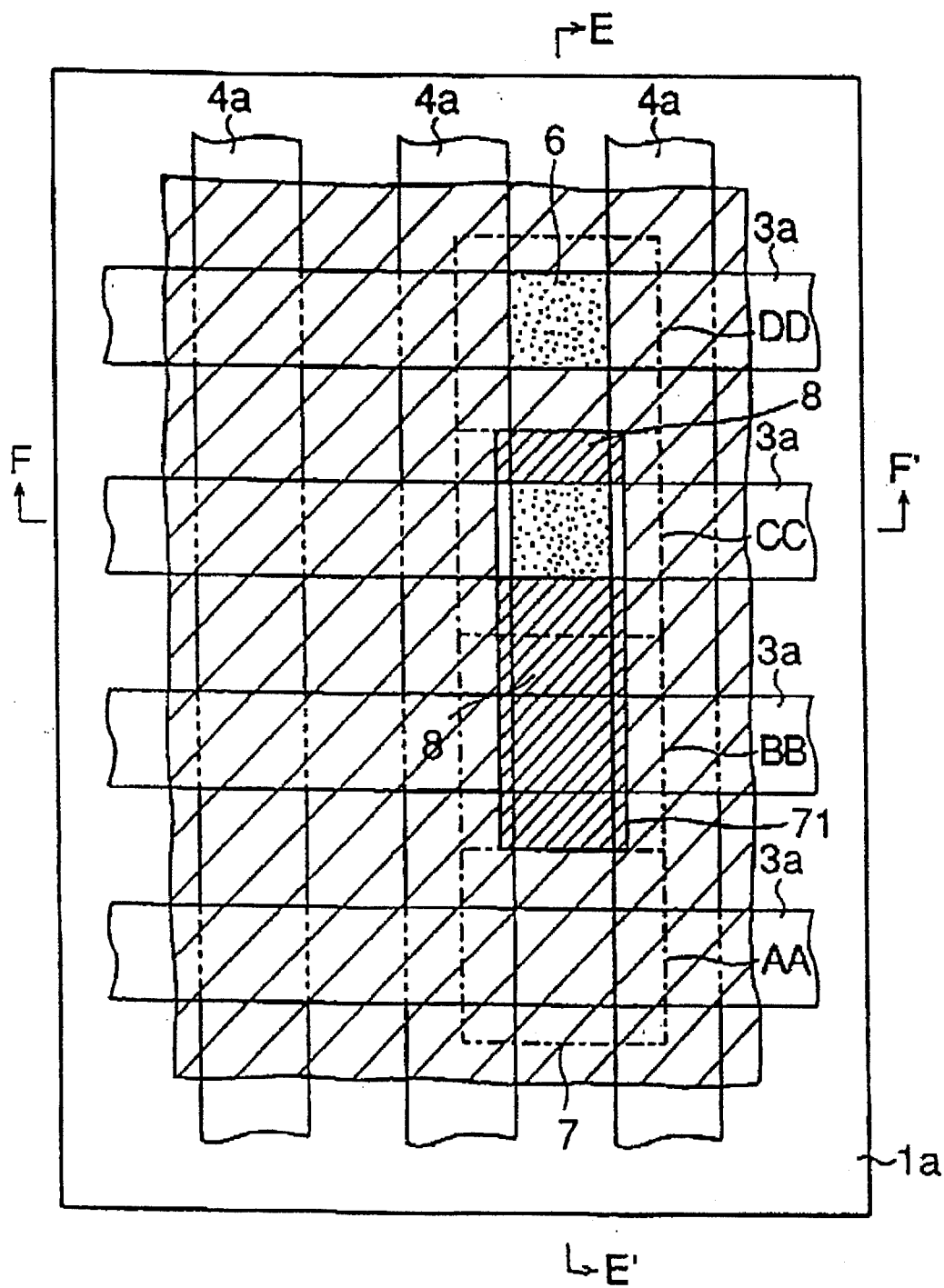
F I G. 12

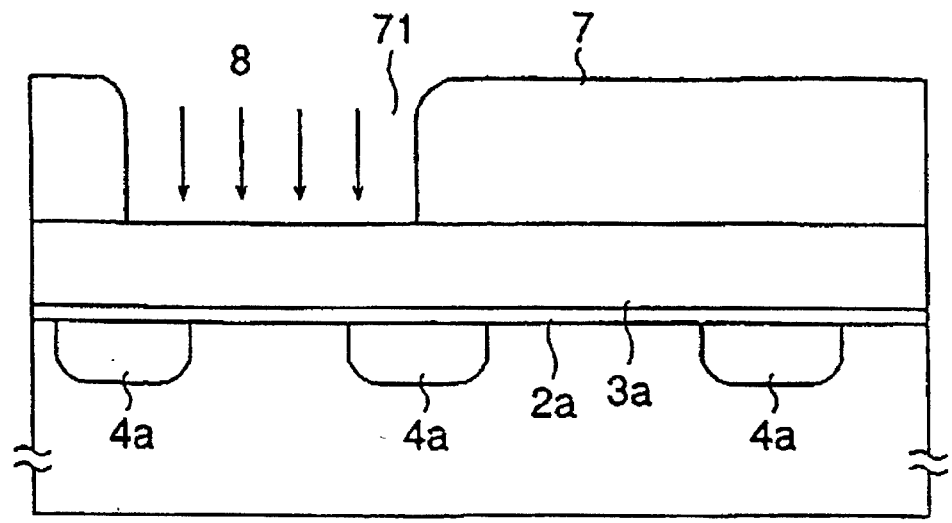
F I G. 13
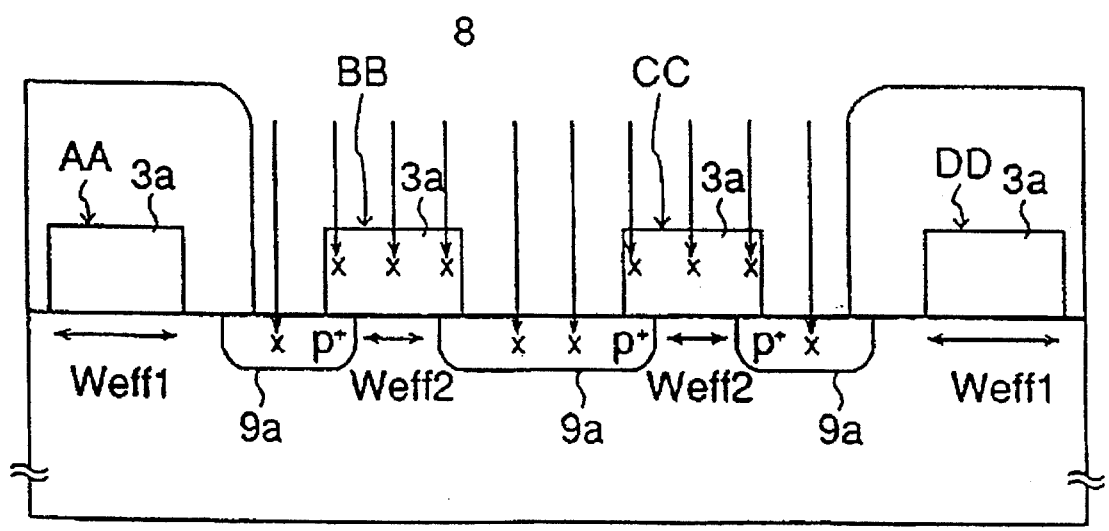
F I G. 14

SEMICONDUCTOR DEVICE WITH ADJUSTABLE CHANNEL WIDTH

BACKGROUND OF THE INVENTION

1. Field of the Invention

The present invention relates to a semiconductor device and its manufacturing method, and more specifically to a semiconductor device provided with a multiple-state ROM (Read Only Memory) for storing multiple-state level data and its manufacturing method.

2. Description of the Prior Art

Conventionally, in a memory cell array of masked ROM (read only semiconductor memory device), a plurality of memory cells composed of MOS transistors are arranged into a matrix pattern; gates of the memory cells are connected to a plurality of word lines extending in the row direction, respectively; and source and drain diffusion regions are connected to a plurality of bit lines extending in the column direction, respectively. FIG. 1 is a circuit diagram thereof, in which the memory cells are arranged into a matrix pattern; each of the gates of the memory cells is connected to each of a plurality of word lines W1, W2, . . . ; and each of the source and drain diffusion regions is connected to each of a plurality of bit lines B1, B2, . . . . Further, the memory cells are of depletion type transistors a to d and of enhancement type transistors (reference symbols omitted).

Now, when data stored in the memory cell a is required to be read, the word line W2 connected to the memory cell a is set to a low level (e.g., 0 V) and all the word lines W1, W3 and W4 other than the word line W2 are set to a high voltage (e.g., 5 V); and further the bit line B1 connected to the memory cell a is set to a high voltage (e.g., 2 V). Under these conditions, if current flows through the memory cell, the memory cell a is determined to be a depletion type transistor; and if no current flows therethrough, the memory cell a is determined to be an enhancement type transistor. In the conventional masked ROM, data of "0" and "1" can be discriminated on the basis of whether the memory cell is of depletion type or enhancement type.

To obtain the transistor of depletion type, ions are implanted appropriately into a channel region formed under a gate electrode and between source and drain regions. In the masked ROM of this structure, however, with the advance of the memory capacity, since the parasitic capacitance of the bit lines increases with increasing number of memory cells connected to the bit lines, the data read speed decreases. To overcome this problem, a ROM for reducing the parasitic capacitance of the bit lines for improvement of the data read speed has been proposed, in which the bit lines are divided into a main bit line group of a long wiring length and a subsidiary bit line group of a short wiring length; the memory cells are accommodated in a plurality of banks, respectively; and the memory cells of each bank are connected to the subsidiary bit lines. In the conventional ROM as described above, however, since one memory cell can store only one-bit data of "0" or "1", when a large-capacity memory is required to be realized, there exists such a drawback that the chip size increases inevitably.

To overcome this problem, another method has been proposed such that 2 or more bit data can be stored in one memory cell to reduce the chip size, which is referred to as a multiple-state ROM. In the multiple-state ROM, the channel conductances of the respective memory cell transistors are set to a plurality of predetermined different values by changing the gate length and/or width of the memory cell transistors. Or the threshold voltages of the memory cell transistors are set to a plurality of different values by controlling the implantation rate of ions into the channel region formed under the gate electrode and between the source and drain regions. In order to control the implantation rate, however, it has been necessary to implant ions several times.

Here, a prior art method of changing the threshold voltage of the transistor will be explained hereinbelow with reference to FIGS. 2 to 4, which is disclosed in Japanese Published Unexamined (Kokai) Patent Application No. 3-185758. FIG. 2 is a plane view showing a transistor formed on a semiconductor substrate; FIG. 3 is a cross-sectional view taken along a line A—A' in FIG. 2; and FIG. 4 is a graphical representation showing the characteristics of dependency of the threshold voltage upon the overlap rate of the transistor gate portion with an ion implantation opening formed on a photoresist. As shown in FIG. 2, a source region 41 and a drain region 42 are arranged at an interval on a principal plane of a p-type silicon semiconductor substrate 1. Further, as shown in FIG. 3, a gate electrode 30 is formed on a gate oxide film 20 over and between the source and drain regions. A field oxide film 90 is formed outside of the active area. In the transistor formed as described above, to obtain the transistor having a predetermined threshold voltage, a photo mask 80 formed with a mask pattern 50 which opens over a gate electrode 30 of the transistor is arranged over the semiconductor substrate 1. Here, an end portion (on the left side) of the mask pattern 50 (the opening 60 in FIG. 2) along the longitudinal direction (the right and left direction in FIG. 2) of the gate electrode 30 is apart by a distance X from end portions (on the left sides) of the source region 41 or drain region 42. On the semiconductor substrate 1, a photoresist 70 is formed, and an implantation opening 60 for determining the threshold voltage thereof is formed in the photoresist 70 so as to correspond to the mask pattern 50. Further, ions are implanted at a predetermined implantation rate through the formed opening 60. In this case, a threshold voltage can be determined by controlling the ion concentration implanted into the channel region between the source and drain regions 41 and 42 of the transistor. That is, the threshold voltage thereof can be decided on the basis of the distance X. In this method, the openings 60 of all the transistors can be formed by only one photolithography and further ions can be implanted to all the transistors simultaneously.

In the above-mentioned structure, however, when the threshold voltages are required to be set to four states of 0.5, 2.3, 4.1 and 5.9 V, for instance, the maximum allowable voltage margin is 1.8 V. In the current situation, however, since there inevitably exists an alignment offset (error) of about 0.2 μm in the photoresist, if the distance X is offset by 0.2 μm as an error, the threshold voltage differs as high as about 2.5 V, as shown in FIG. 4. In other words, in the case where the four states are required to be formed by changing the effective channel width of the transistors in accordance with this method, it has been necessary to increase the channel width sufficiently wide to such an extent that the channel width dispersion due to the mask alignment error can be disregarded, for instance to such an extent that $W/4 >> 0.2$ μm can be satisfied (where W is a channel width), with the result that the cell size itself has been inevitably increased.

In summary, in the conventional method, when the multiple-state ROM of small cells is formed, since the channel width disperses due to the alignment error of the photoresist, the channel conductance gm inevitably changes, thus causing a problem in that the threshold voltage disperses. As a result, in the prior art multiple-state ROM, it has been difficult to increase the integration rate and the capacity of the multiple-state ROM.

SUMMARY OF THE INVENTION

With these problems in mind, therefore, it is the object of the present invention to provide a semiconductor device which can change the channel conductance by deciding the channel width accurately in accordance with gate self-alignment method.

Further, the object of the present invention is to provide a semiconductor device and its manufacturing method, by which the channel conductance can be changed by controlling the channel width accurately even if there exists an alignment error in the photoresist, and in addition the semiconductor device is provided with a multiple-state ROM for realizing a plurality of read states by changing the threshold voltages thereof.

To achieve the above-mentioned objects, the present invention provides a semiconductor device, comprising: a semiconductor substrate: first conductivity type source and drain regions formed on the semiconductor substrate; a gate insulating film formed on the semiconductor substrate; a gate electrode formed on the source and drain regions and on a channel region formed and sandwiched between the source and drain regions, via the gate insulating film; a second conductivity type impurity diffusion region formed at least on one side of the channel region, the one side being different from sides thereof at which the channel region is sandwiched between the source and drain regions, the second conductivity type being opposite to the first conductivity type, and an impurity concentration of the second conductivity type impurity diffusion region being higher than that of the semiconductor substrate; and the impurity diffusion region being formed by ion implantation in accordance with self-alignment of the gate electrode and with thermal diffusion, in such a way that width of the channel region can be limited to a predetermined value.

Further, the present invention provides a semiconductor device, comprising: a semiconductor substrate: a plurality of first conductivity type source and drain regions formed on the semiconductor substrate and arranged substantially in parallel to each other; a gate insulating film formed on the semiconductor substrate; a plurality of gate electrodes formed on the semiconductor substrate via the gate insulating film and arranged substantially in parallel to each other so as to cross a plurality of the source and drain regions; at least one second conductivity type impurity diffusion region formed at least on one side of a channel region sandwiched between at least one pair of the source and drain regions, the one side being different from sides of the channel region at which the channel region is sandwiched between the one pair, the second conductivity type being opposite to the first conductivity type, and an impurity concentration of the second conductivity type impurity diffusion region being higher than that of the semiconductor substrate; and a channel width of the channel region of at least one first semiconductor device including the at least one impurity diffusion region being determined different from that of the channel region sandwiched between the source and drain regions of at least one second semiconductor device not including the impurity diffusion region so that threshold voltages of the first and second semiconductor devices can be set to two predetermined different values, respectively.

In the semiconductor device of the present invention, the channel width of the first semiconductor is narrower than that of the second semiconductor. Further, the first and second semiconductors constitute memory cells, respectively and a plurality of the memory cells are arranged into a matrix pattern.

Further, the present invention provides a method of manufacturing a semiconductor device, which comprises the steps of: forming a plurality of first conductivity type source and drain regions substantially in parallel to each other on a semiconductor substrate; forming a gate insulating film on the semiconductor substrate; forming a plurality of gate electrodes substantially in parallel to each other on the semiconductor substrate via the gate insulating film so as to cross a plurality of the source and drain regions; forming at least one second conductivity type impurity diffusion region at least on one side of a channel region sandwiched between at least one pair of the source and drain regions, the one side being different from sides of the channel region at which the channel region is sandwiched between the one pair, in such a way that the second conductivity type is opposite to the first conductivity type and an impurity concentration of the second conductivity type impurity diffusion region is higher than that of the semiconductor substrate; and determining a channel width of the channel region of at least one first semiconductor including the at least one impurity diffusion region narrower than that of the channel region sandwiched between the source and drain regions of at least one second semiconductor not including the impurity diffusion region so that threshold voltages of the first and second semiconductors can be set to two predetermined different values.

In the method of manufacturing a semiconductor device, the step of changing the channel width includes a step of forming the impurity diffusion region so as extend into the channel region. Further, the step of adjusting the threshold voltages includes a step of determining the threshold of one of the first and second semiconductors to be higher than that of the other thereof by ion implantation.

BRIEF DESCRIPTION OF THE DRAWINGS

FIGS. 6A and 6B are cross-sectional views taken along the lines A–A' and B–B' shown in FIG. 5, respectively;

FIGS. 7A and 7B are cross-sectional views taken along lines C–C' and D–D' shown in FIG. 5, respectively;

FIG. 10 is a cross-sectional view taken along the line F–F' shown in FIG. 9;

FIG. 11 is a cross-sectional view taken along the line E–E' shown in FIG. 9;

FIG. 12 is another plane view showing the manufacturing process of the second embodiment of the semiconductor device;

FIG. 13 is a cross-sectional view taken along the line F-F' shown in FIG. 12;

FIG. 14 is a cross-sectional view taken along the line E-E' shown in FIG.12.

DETAILED DESCRIPTION OF THE PREFERRED EMBODIMENTS

Embodiments of the present invention will be described hereinbelow with reference to the attached drawings.

Figure 1:
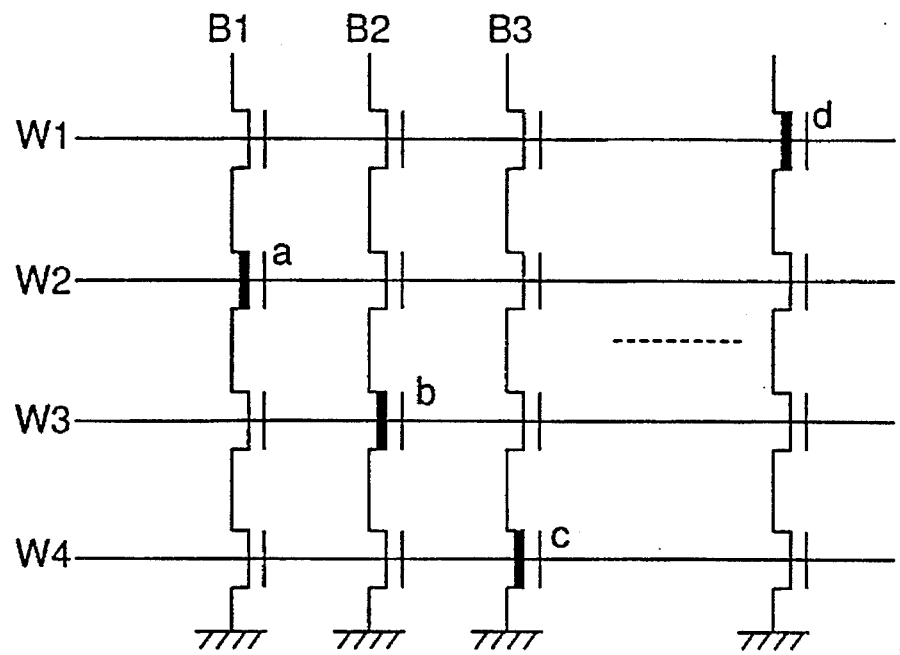
FIG. 1 is a circuit diagram showing a prior art masked ROM.
Figure 2:
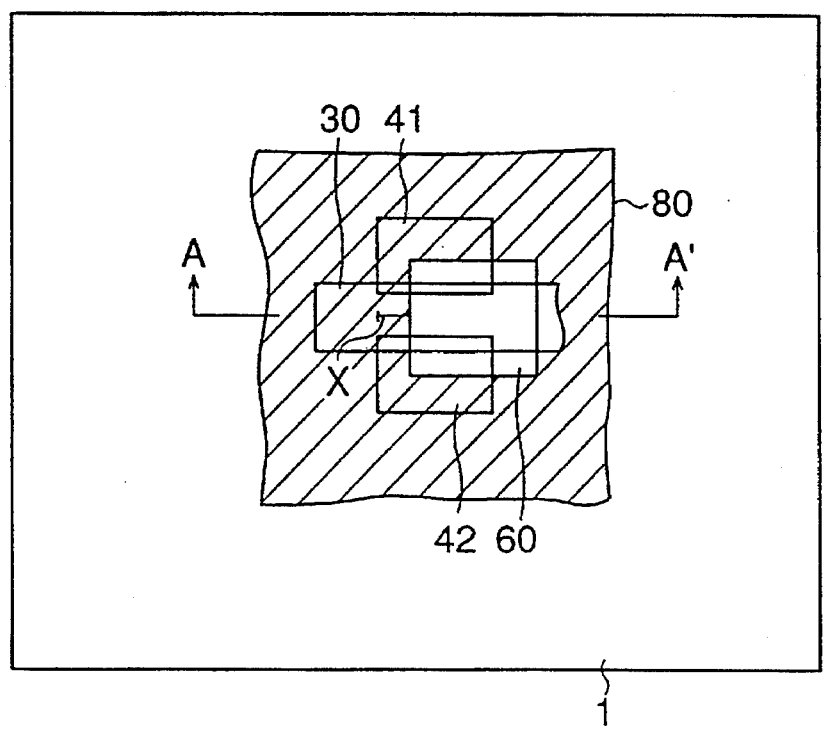
FIG. 2 is a plane view showing a prior art semiconductor device.
Figure 3:
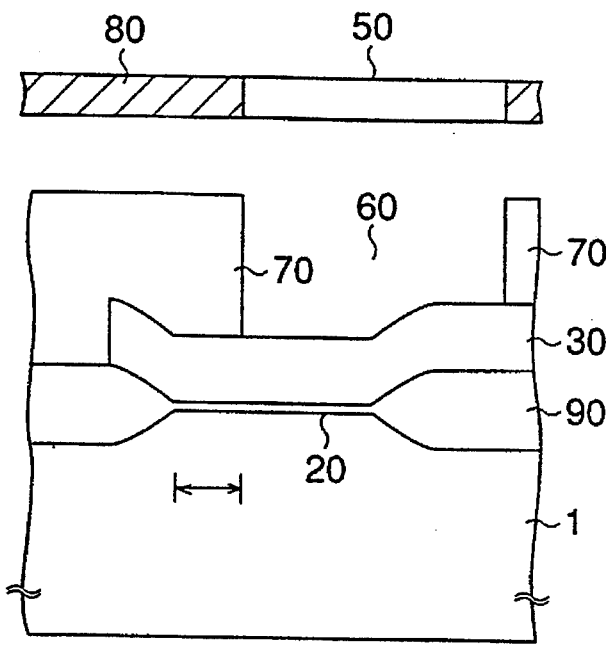
FIG. 3 is a cross-sectional view taken along the line A–A' in FIG. 2.
Figure 4:
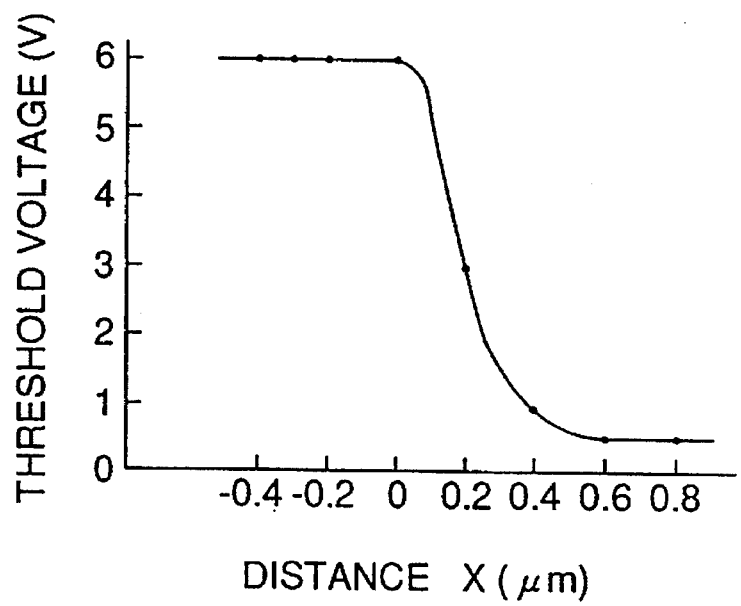
FIG. 4 is a characteristic graph showing the relationship between the threshold voltage and the overlap rate between the gate of the semiconductor device shown in FIG. 2 and the ion implantation opening of a photoresist.
Figure 5:
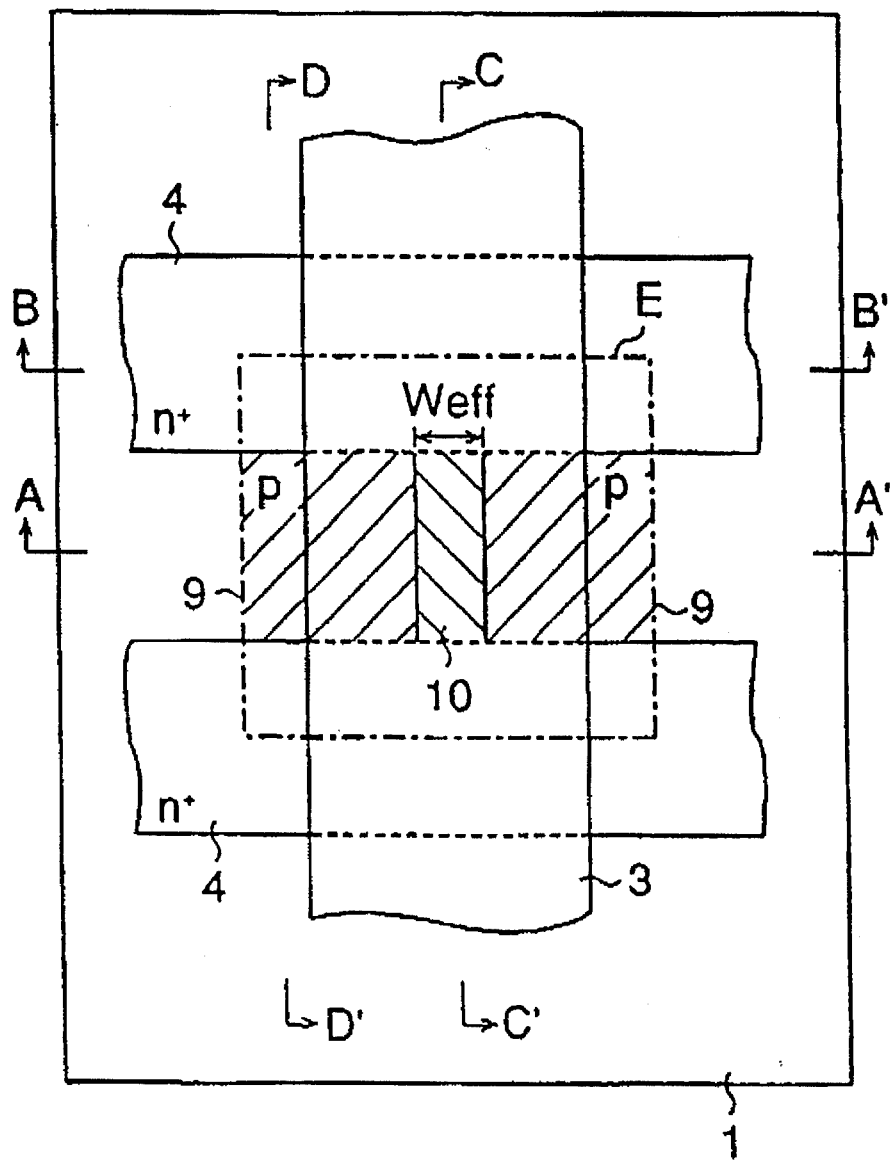
FIG. 5 is a plane view showing a first embodiment of the semiconductor device according to the present invention.

A first embodiment of a semiconductor device for a NOR type ROM will be described with reference to FIGS. 5 to 7. FIG. 5 is a plane view showing the transistor formed on a semiconductor substrate; FIGS. 6A and 6B are cross-sectional views taken along the lines A–A' and B–B', respectively in FIG. 5; and FIGS. 7A and 7B are cross-sectional views taken along lines C–C' and D–D', respectively in FIG. 5. The transistor of the present invention is characterized in that at least one impurity diffusion region 9 for limiting the channel width is additionally formed on the semiconductor substrate. Further, in the same way as with the case of the prior art technique as already explained, a p-type silicon semiconductor substrate 1 is used. However, it is of course possible to use an n-type semiconductor substrate in the present invention.

As shown in FIGS. 5 to 7, a pair of n$^+$ type impurity diffusion regions 4 are formed on the principal plane of the semiconductor substrate 1. A pair of the impurity diffusion regions 4 are arranged roughly in parallel to each other, which are used as source and drain regions of the transistor. Further, a gate insulating film 2 of silicon oxide is formed on the principal plane of the semiconductor substrate 1. A pate electrode 3 of poly silicon, for instance is formed on the principal plane thereof via the gage insulating film 2 in such a way that the gate electrode 3 crosses the source and drain regions 4.

A channel region 10 exists between the source and drain regions 4 (n$^+$ impurity diffusion regions) and under the gate electrode 3. Into this channel region 10, impurity ions are implanted to determine the threshold voltage of the transistor to a predetermined value at need.

A pair of p-type impurity diffusion regions 9 are formed between the source and drain regions 4 formed on the principal plane in such a way that the regions 9 sandwich the channel region 10 from both sides thereof. The p-type impurity diffusion regions 9 are formed by ion implantation in accordance with self-alignment with the gate electrode 3 as a mask and subsequent thermal diffusion. Further, the concentration of the p-type impurity diffusion regions 9 is determined higher than that of the semiconductor substrate 1 to reduce the effective channel width (Weff) of the channel region 10. Further, as shown in FIG. 6A, when there exists no p-type impurity diffusion region 9, the effective channel width is Weff1. However, since the p-type impurity diffusion regions 9 are formed by ion implantation in accordance with the self-alignment with the gate electrode 3 as a mask and subsequent thermal diffusion, it is possible to decide and reduce the effective channel width from Weff1 to Weff2. A decrease in the effective channel width can reduce the channel conductance of the transistor. A region E shown in FIG. 5 denotes a transistor region. Further, it is unnecessary to form the two impurity diffusion regions 9 so as to sandwich the channel region 10; that is, there exists no problem when only the single region 9 is formed on one side (e.g., A) of the channel region 10 along the line A–A' in FIG. 5.

Figure 8:
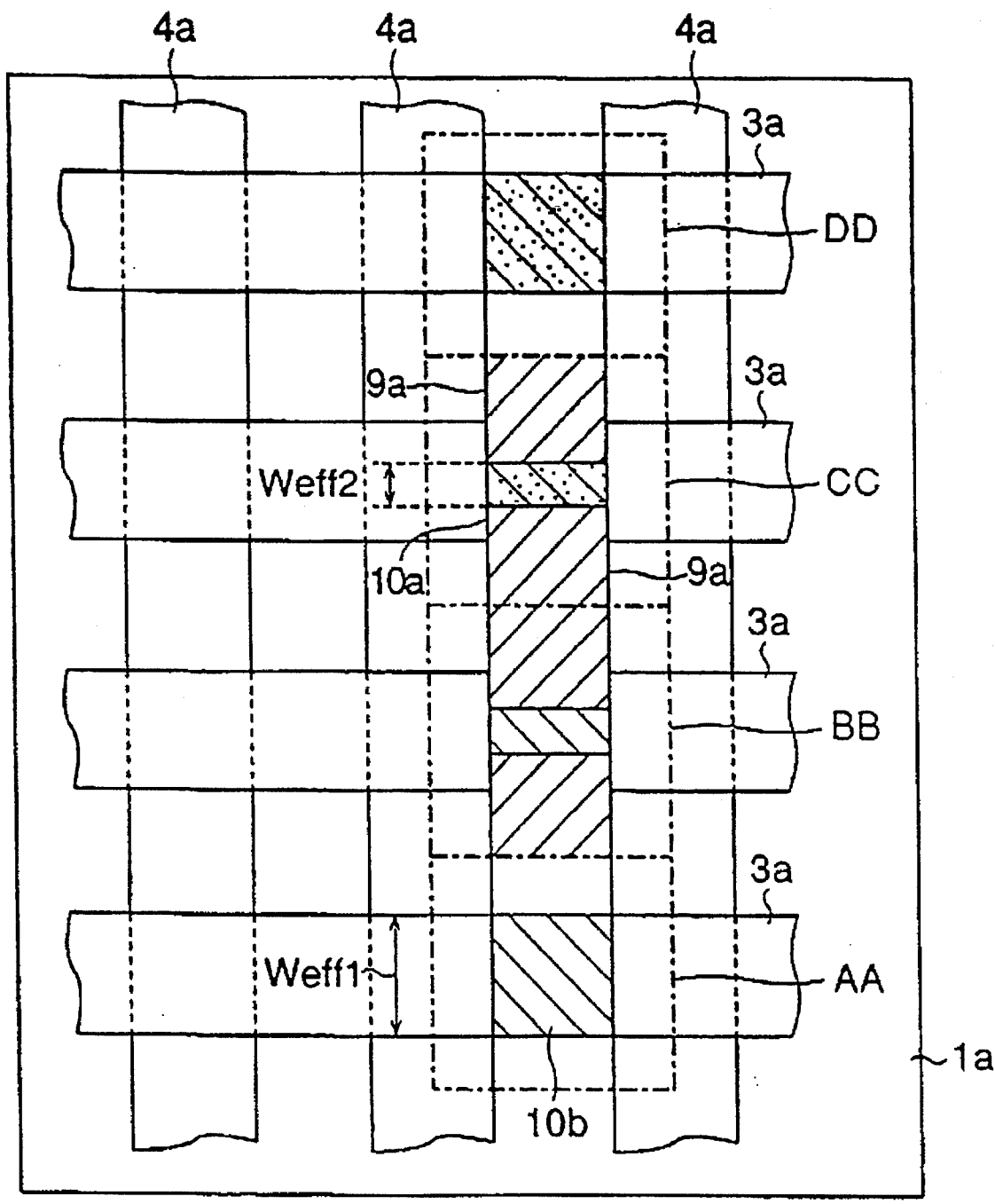
FIG. 8 is a plane view showing a second embodiment of the semiconductor device according to the present invention.
Figure 9:
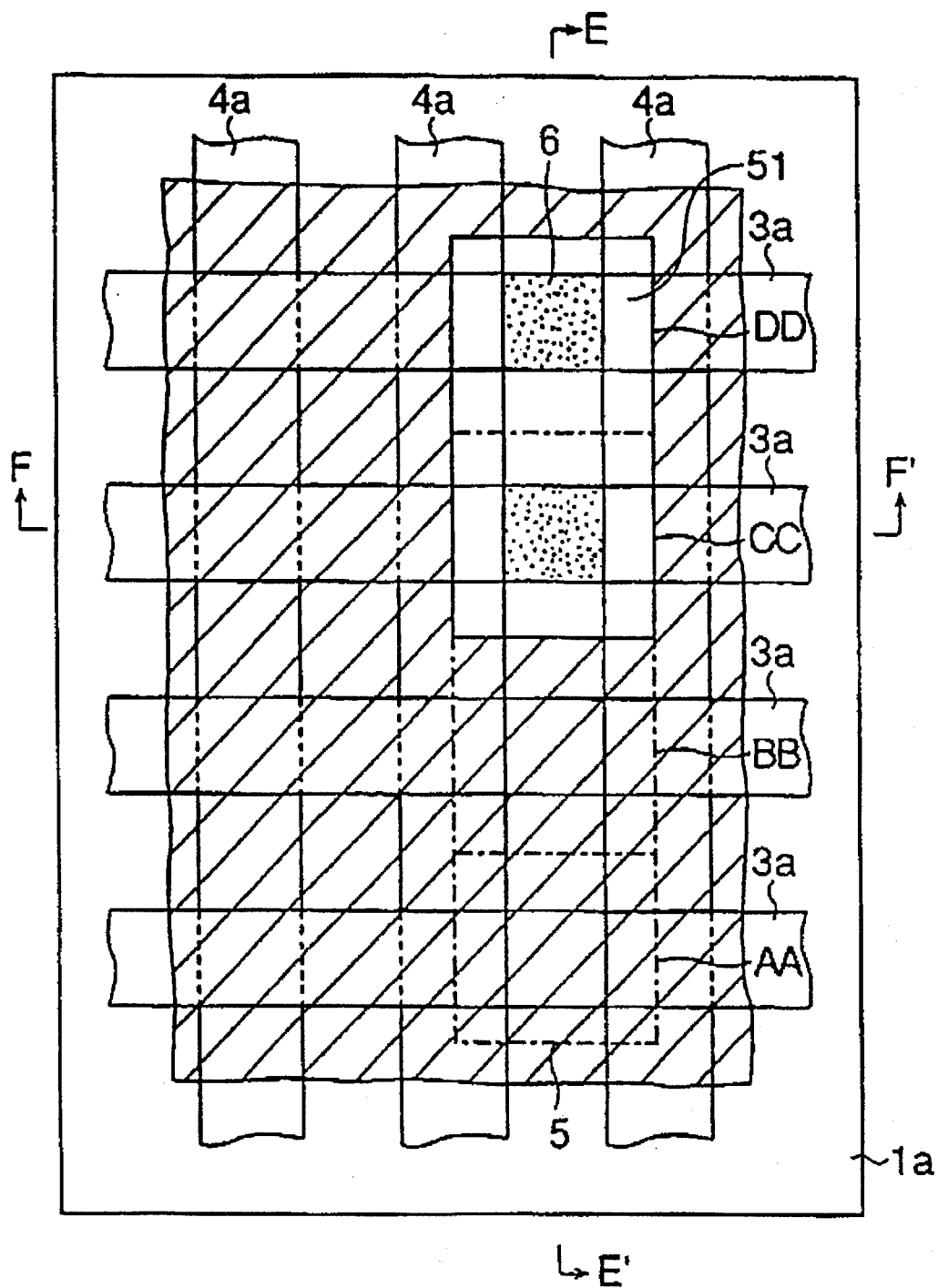
FIG. 9 is a plane view showing the manufacturing process of the second embodiment of the semiconductor device.
Figure 15:
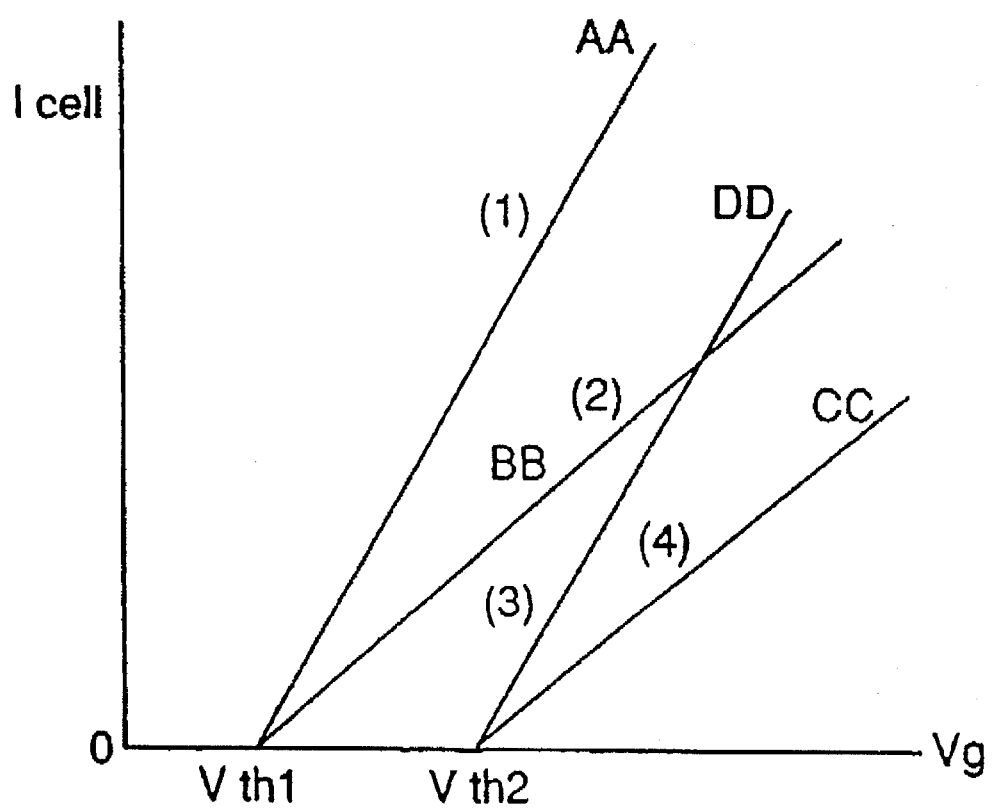
FIG. 15 is a graphical representation showing the current and voltage characteristics of the second embodiment of the semiconductor device of the present invention.

A second embodiment of the present invention will be described hereinbelow with reference to FIGS. 8 to 15, in which a memory cell array of NOR type ROM is formed on the semiconductor substrate. A plurality of transistors constitute the respective memory cells of the memory cell array. FIG. 8 is a plane view showing the semiconductor substrate on which the memory cell array is formed; FIGS. 9 and 12 are plane views for assistance in explaining the manufacturing process of the memory cell array shown in FIG. 8; FIG. 10 is a cross-sectional view taken along the line F-F' shown in FIG. 9; FIG. 11 is a cross-sectional view taken along the line E-E' shown in FIG. 9; FIG. 13 is a cross-sectional view taken along the line F-F' shown in FIG. 12; FIG. 14 is a cross-sectional view taken along the line E-E' shown in FIG. 12; and FIG. 15 is the current and voltage characteristics of the memory cell shown in FIG. 8. In FIG. 8, a plurality of straight n$^+$ type impurity diffusion regions 4a are formed on the principal plane of a p-type semiconductor substrate 1a. Further, on the principal plane thereof, a gate insulating film 2a of silicon oxide (shown in FIG. 10) is formed. Further, on the semiconductor substrate 1, a plurality of gate electrodes 3a of poly silicon are formed on the semiconductor substrate 1 via the gate insulating film 2a so as to cross the n$^+$ impurity diffusion regions 4a, respectively. A pair of adjacent impurity diffusion regions 4a formed under the two adjacent gate electrodes 3a are source and drain regions, and a region formed between the source and drain regions 4a is used as the channel region so as to form one memory cell. On the semiconductor substrate 1a, a plurality of memory cells AA, BB. CC, DD, ... are arranged into a matrix pattern.

In the multiple-state ROM of this second embodiment, as already explained with reference to FIG. 6A, two bit information data can be recorded in one memory cell by changing the channel conductance gm (by changing the channel width Weff) and further by changing the threshold voltage (by changing the ion implantation rate). In other words, in order to store 4 states of 2-bit data, the channel conductance and the threshold voltage of the memory cell are controlled. As shown in FIG. 15, when ions are implanted into the memory cells CC and DD, the threshold voltage these memory cells CC and DD is set to Vth2, which is higher than that Vth1 of the memory cells AA and BB into which no ions are implanted. In this second embodiment, a plurality of memory cells have either one of the two channel widths Weff1 and Weff2. As shown in FIG. 8, to change the channel width of the channel region 10a, the p-type impurity diffusion regions 9a are formed on the semiconductor substrate 1a so as to extend toward and into the channel region 10a. When the impurity diffusion regions 9a extend into the channel region 10a, it is possible to change the substantial width of the channel region 10a. In the case shown in FIG. 8, the substantial channel width of the memory cells BB and CC is reduced to Weff2 by forming the p-type impurity diffusion regions 9a on both sides thereof, as compared with the channel width Weff1 of the channel region 10b of the memory cells AA and DD having no regions 9a, respectively. Further, it is unnecessary to form the two impurity diffusion regions 9a on both sides of the channel region 10a so as to sandwich the channel region 10a; that is, it is possible to change the channel width of the channel region 10a by forming only the single impurity diffusion region 9a (e.g., on the side of the memory cell DD in FIG. 8).

As described above, since the respective memory cells have a high threshold voltage (as in the memory cells CC and DD) and a low threshold voltage (as in the memory cells AA and BB) and further a substantially wide channel width (as in the memory cells AA and DD) and a substantially narrow channel width (as in the memory cells BB and CC), respectively, when these threshold voltages and channel widths are combined with each other, it is possible to realize 4 states of the memory cells, so that the four memory cells AA, BB, CC and DD have 4 different memory states, as shown in FIG. 15.

With reference to FIGS. 9 to 14, the process of manufacturing the memory cell array of the second embodiment will be explained hereinbelow. In FIG. 9, the silicon oxide film 2a (shown in FIG. 10) with a thickness of about 20 nm is formed on the p-type silicon semiconductor substrate 1a, and further the poly silicon gate electrodes 3a with a thickness of about 40 nm are formed on the silicon oxide film 2a in accordance with CVD (chemical vapor deposition). These gate electrodes 3a are doped to n-type by diffusing phosphorus. Further, the n-type impurity diffusion regions 4a, for instance are formed by implanting arsenic ions at an ion implantation rate of $3 \times 10^{15}$ cm$^{-2}$. Further, all over the surface of the silicon semiconductor substrate 1a, ions are implanted at a low acceleration voltage of 40 keV and at an ion implantation rate of $5 \times 10^{12}$ to $1 \times 10^{13}$ cm$^{-2}$ for prevention of reversal of the conductivity types.

Here, the process of impurity ion implantation for changing the threshold voltage of the predetermined memory cells of the memory cell array formed on the semiconductor substrate 1a will be explained. As already explained, on the principal surface of the semiconductor substrate 1a, the n type impurity diffusion regions 4a are formed as the source and drain regions roughly at regular intervals in stripe shape. Further, the silicon oxide film 2a is formed on the principal plane of the semiconductor substrate 1a, and the poly silicon gate electrodes 3a are formed on the silicon oxide film 2a roughly at regular intervals in stripe shape. The gate electrodes 3a are formed so as to cross the n-type impurity diffusion regions 4a at roughly right angles.

Further, as shown in FIGS. 10 and 11, a photoresist 5 is applied to all over the surface of the principal plane of the semiconductor substrate 1a, and openings 51 for exposing the predetermined memory cells (CC and DD) are formed by patterning the photoresist 5 by use of a first data forming mask. Then, boron ions 6 are implanted at 160 keV and at $1 \times 10^{13}$ to $1 \times 10^{14}$ cm$^{-2}$, with the result that ions 6 can be implanted into the channel regions of the memory cells CC and DD. Here, although boron ions 6 implanted into the gate electrode 3a reach the surface region of the semiconductor substrate 1a under the gate electrode 3a, since boron ions 6 implanted directly to the surface of the semiconductor substrate 1a reach deep (about 0.5 μm or deeper) into semiconductor substrate 1a, these ions will not exert influence upon the threshold voltage and the channel width by the subsequent heat treatment effected after the manufacturing process.

After the ion implantation, the photoresist 5 is removed. Further, another photoresist 7 is formed all over the principal surface of the semiconductor substrate 1a, as shown in FIG. 12, and openings 71 for exposing the predetermined memory cells (BB and CC) are formed by patterning the photoresist 7 by use of a second data forming mask. Further, as shown in FIGS. 13 and 14, boron ions 8 are implanted into the semiconductor substrate 1a via the photoresist 7 and through the openings 71 at a low acceleration voltage (40 keV). Since being implanted at the low acceleration voltage, boron ions 8 cannot pass through the gate electrodes 3a but implanted only the surface region of the semiconductor substrate 1a on both sides of the gate electrodes 3a.

Successively, the semiconductor substrate 1a is heat treated at about 900° to 950° C. for about one hour. By this heat treatment, boron ions are diffused in the lateral direction of the silicon semiconductor substrate 1a, so that p$^+$ impurity diffusion regions 9a can be formed so as to extend toward and into the channel regions formed under the gate electrodes 3a of the memory cells BB and CC, respectively. As a result, since a part of the channel region is replaced with the p$^+$ impurity diffusion region 9a, it is possible to reduce the effective channel width Weff thereof.

In the case of this second embodiment, since boron ions are not implanted to the memory cells AA and DD, the p$^+$ impurity diffusion regions 9a are not formed, so that the effective channel width Weff1 is kept at 0.5 μm, for instance. However, since boron ions are implanted to the memory cells BB and CC, the p$^+$ impurity diffusion regions 9a extend to the channel regions formed under the gate electrodes 3a, so that the effective channel width Weff2 of the memory cells can be reduced to such an extent as 0.25 μm.

As described above, in the memory cells of the memory cell array of the second embodiment, it is possible to select 4 memory states by combining 2 threshold voltages and 2 channel widths appropriately. In FIG. 15, the memory cell AA having the low threshold voltage Vth1 end the wide channel width Weff1 is provided with the first current and voltage characteristics (1); the memory cell BB having the low threshold voltage Vth1 and the narrow channel width Weff2 is provided with the second current and voltage characteristics (2); the memory cell DD having the high threshold voltage Vth2 and the wide channel width Weff1 is provided with the third current and voltage characteristics (3); and the memory cell DD having the high threshold voltage Vth2 and the narrow channel width Weff2 is provided with the fourth current and voltage characteristics (4).

In the above-mentioned embodiments, although the NOR type transistors have been explained by way of example, the present invention can be applied to NAND type transistors. Further, 4 states can be obtained by changing only the channel width and further 2 states can be obtained by changing only the threshold voltage. Accordingly, when these two methods are combined with each other, it is possible to obtain 8-state ROM, so that 3-bit information can be stored in one memory cell array. In contrast with this, to store 3-bit data in one memory cell array, it is also possible to obtain an 8-state ROM on the basis of 2 states obtained by changing the channel width and 4 states obtained by changing the threshold voltage. Further, in the above-mentioned embodiments, although the p-type silicon semiconductor substrate is used, without being limited thereto, it is of course possible to use an n-type silicon semiconductor substrate.

As explained above, in the semiconductor device according to the present invention, the channel conductance can be changed easily by controlling the channel width accurately on the basis of the impurity diffusion regions formed in the semiconductor substrate. In addition, according to the present invention, the semiconductor device provided with a multi-stat ROM can be realized, in which a plurality of read states can be obtained by changing the channel conductance accurately on the basis of change in the channel width (even if there exists an alignment error of the photoresist) and the threshold voltage in combination.

What is claimed is:

1. A semiconductor device comprising:

a semiconductor substrate;

a plurality of first conductivity type source regions substantially in parallel to each other in a surface of said semiconductor substrate and including two end source regions separated by plural intermediate source regions;

a plurality of first conductivity type drain regions substantially in parallel to each other in the surface of said semiconductor substrate and including two end drain regions separated by plural intermediate drain regions, said substrate being of second conductivity type opposite to said first conductivity type;

a gate insulating film on a portion of the surface of said semiconductor substrate between said plurality of source regions and said plurality of drain regions;

a plurality of gate electrodes on said gate insulating film between said plurality of source and said plurality of drain regions and respectively covering a plurality of channel regions beneath said gate insulating film;

at least one second conductivity type impurity diffusion region in the surface of the semiconductor substrate at least on one side of at least a first one of said channel regions of a first effective channel width extending between one of said intermediate source regions and one of said intermediate drain regions, the impurity concentration of said at least one second conductivity type impurity diffusion region being higher than the impurity concentration of said semiconductor substrate; and at least a second one of said channel regions between one of said end source regions and one of said end drain regions having a second effective channel width sufficiently wider than said first effective channel width such that the effective threshold for a semiconductor component including said one end source region and said one end drain region is measurably higher than the effective threshold for a semiconductor component including said one intermediate source region and said one intermediate drain region.

2. The semiconductor device of claim 1, further including in said substrate another second conductivity type impurity diffusion region separated from said at least first one of said channel regions by said at least one impurity diffusion region, said other impurity diffusion region having an impurity concentration higher than an impurity concentration of said substrate.

3. The semiconductor device of claim 1, further including in said substrate another second conductivity type impurity diffusion region separated from said at least first one of said channel regions by said at least one impurity diffusion region, said other impurity diffusion region having an impurity concentration higher than an impurity concentration of said substrate by an amount related to a difference between the second effective channel width and the first effective channel width.

* * * * *